United States Patent [19]

Strobach

[11] Patent Number: 5,371,413
[45] Date of Patent: Dec. 6, 1994

[54] PROCESS AND ARRANGEMENT FOR THE BOOLEAN REALIZATION OF ADALINE-TYPE NEURAL NETWORKS

[75] Inventor: Peter Strobach, Müchen, Germany

[73] Assignee: Siemens Aktiengesellschaft, Munich, Germany

[21] Appl. No.: 983,531

[22] PCT Filed: Aug. 29, 1991

[86] PCT No.: PCT/EP91/01641

§ 371 Date: Mar. 4, 1993

§ 102(e) Date: Mar. 4, 1993

[87] PCT Pub. No.: WO92/04687

PCT Pub. Date: Mar. 19, 1992

[30] Foreign Application Priority Data

Sep. 11, 1990 [DE] Germany .............. 90117475

[51] Int. Cl.$^5$ .............................. G06F 15/18
[52] U.S. Cl. .................... 326/104; 395/27; 326/35
[58] Field of Search .......... 307/201, 445; 395/27

[56] References Cited

U.S. PATENT DOCUMENTS

| | | | |
|---|---|---|---|
| 4,518,866 | 5/1985 | Clymer | 307/201 |
| 4,994,982 | 2/1991 | Duranton et al. | 307/201 X |
| 5,131,073 | 7/1992 | Furuta et al. | 395/27 |
| 5,170,071 | 12/1992 | Shreve | 395/27 X |

OTHER PUBLICATIONS

Mead and Conway, *Introduction to VLSI Systems*, Addison-Wesley Publ. Col., Reading, Mass., 1980, p. 152.
"Functionality of Multilayer Boolean Neural Networks", R. Al-Alawi et al, Electronics Letters, vol. 25, No. 10, May 11, 1989, pp. 657-659.
"Layered Neural Nets for Pattern Recognition", by B. Wildrow et al, IEEE Transactions on Acoustics, Speech & Signal Processing, vol. 36, No. 7, Jul. 1988, pp. 1109-1118.
"Multi-Scale Dynamic Neural Net Architectures", by L. Atlas et al, IEEE Pacific Rim Conference On Communications, Computers & Signal Processing, Jun. 1, 1989, pp. 509-512.
"A Neural Network with Boolean Output Layer", by P. Strobach, IEEE International Conference on Acoustics, Speech, & Signal Processing, Albuquerque, NM, Apr. 3, 1990, pp. 1-4.
"A Programmable Analog Neural Computer & Simulator", by P. Müller et al, Adv. Neural Inform. Proc. Systems, 1, D. S. Touretzky (ed.), M. Kaufmann Publ., San Mateo, Calif., 1989, pp. 712-719.
"Digital Realisation of Self-Organising Maps", by N. M. Allinson et al, Adv. Neural Inform. Proc. Systems 1, D. S. Touretzky (ed.), M. Kaufmann Publ., San Mateo, Calif., 1989, pp. 728-738.

*Primary Examiner*—David R. Hudspeth
*Attorney, Agent, or Firm*—Hill, Steadman & Simpson

[57] ABSTRACT

A process is stated with which ADALINE-type neural networks whose inputs are Boolean variables can be realized using Boolean functions. In addition, a purely digital circuit arrangement for realizing ADALINE-type neural networks is stated. The digital circuit arrangement can be constructed with the aid of a digital base circuit. The digital base circuit generates the set of Boolean functions which replaces a neuron for any value of its input weighting factors. A process for training the circuit arrangement is stated. It is thus possible to realize and to train ADALINE-type neural networks entirely with the aid of purely digital circuit arrangements.

3 Claims, 7 Drawing Sheets

FIG 4 — Hyperplane outside standard cube

PROCESS AND ARRANGEMENT FOR THE BOOLEAN REALIZATION OF ADALINE-TYPE NEURAL NETWORKS

BACKGROUND OF THE INVENTION

Neural networks are becoming increasingly important in many areas of adaptive signal processing and pattern recognition (D. E. Rumelhart, J. L. McClelland, Parallel Distributed Processing, Vols. I and II, MIT Press, Cambridge, Mass., 1986). There are different types of neural networks adapted to different tasks. Purely forward-coupled ADALINE-type neural networks are preferably used in pattern recognition (B. Widrow, R. G. Winter, R. A. Baxter, "Layered neural nets for pattern recognition", IEEE Trans. on ASSP, Vol. ASSP-36, No. 7, pp. 1109–1118, 1988).

The basic element of the ADALINE network is the "adaptive linear neuron" (ADALINE). This is understood to be a linear combiner followed by a sign decision means. The linear combiner generates a weighted sum from N input signals whose sign is determined by the sign decision means (single-stage quantizer) and is output as the output signal of the ADALINE (P. Strobach, "A neural network with Boolean Output Layer", Proc. IEEE Int. Conf. on ASSP, Albuquerque, N. Mex., April 1990).

By connecting such ADALINE neurons in series, ADALINE networks are obtained which—depending on the values of the weighting factors of the linear combiners —assign binary output signals to the signals applied to the free input nodes of the network.

These binary output signals are interpreted as a classification of the input signals. The input signals may be taken here from binary values, discrete multi-valued values, or an interval of continuous values. In order to be able to set a desired classification of the input signals by means of the neural network, the values of the weighting factors must be quasi-continuously variable. In a training process to determine the wanted values of the weighting factors, the latter are varied, with the aim of minimizing a measure for the deviation between the actual output signals of the network and the desired output signals (nominal responses) for a set of training data, until the actual responses correspond sufficiently precisely to the nominal responses.

For this reason, all known realizations of neural networks are designed either with the aid of analog circuits (P. Müller et al, "A Programmable Analog Neural Computer and Simulator", Adv. Neural Inform. Proc. Systems 1, D. S. Touretzky (ed.), Morgan Kaufmann Publ., San Mateo, Calif., 1989, pp. 712–719) or with the aid of digital circuits with a high word width (N. M. Allinson, "Digital Realization of Self-Organizing Maps", Adv. Neural Inform. Proc. Systems 1, D. S. Touretzky (ed.), Morgan Kaufmann Publ., San Mateo, Calif., 1989, pp. 728–738). In the latter, the continuous input signals and weighting factors are approximated by a large number of discrete stages which are represented by binary variables with a large word width. In all known realizations of ADALINE networks the linear combiners require a very high outlay for circuitry, which hinders the hardware realization of neural networks with comparatively large numbers of neurons.

SUMMARY OF THE INVENTION

Multilayer networks are required for most applications of neural networks in pattern recognition (Rumelhart 1986). The neurons of the first layer are connected here directly to the input nodes. The output signals of the neurons of the first layer form the input signals of the neurons of the second layer. In general the output signals of the neurons of one layer form the input signals of the neurons of the following layer. Since the output signals of all the neurons are binary, the input signals of the neurons of all the higher layers are also automatically binary. The sub-network of the higher layers thus always "sees" binary input signals even if the actual input signals of the overall network can assume values other than only binary ones. The sub-network of the higher layers is thus also termed the "Boolean output layer". The subject-matter of the invention is a process and an arrangement for the realization of ADALINE-type neural networks with Boolean input signals using exclusively Boolean functions and digital circuits.

The ADALINE network can be here the "Boolean output layer" of a more complex network with discrete multi-valued or continuous input signals. However, there are also applications in which the input signals have primarily binary values. In this case, the entire network can be realized exactly by means of purely digital circuits, whereas in general only the "Boolean output layer", which, however, usually accounts for by far the greatest part of the network, is to be realized by means of purely digital circuits.

In general the present invention is a process for realizing ADALINE-type neural networks whose inputs are Boolean variables using Boolean functions. First neurons with $2^n$ binary inputs are developed in binary trees having $2^2-2$ adaptive linear combiners and a second neuron with two inputs in each case. The adaptive linear combiners are converted into second neurons by insertion of binary quantizers between their outputs and the inputs of the combiners following them. The weighting factors of those second neurons which correspond to the leaves of the binary trees are selected to correspond to the weighting factors of the first neurons. The weighting factors of the other second neurons on the branches of the binary trees, which precede the binary quantizers, are represented by the absolute amounts of the output values of the adaptive linear combiners preceding the quantizers. All $2^n-1$ second neurons are replaced by their corresponding Boolean functions of two variables depending on their input weighting factors.

The present invention is also a circuit arrangement for realizing ADALINE-type neural networks using Boolean functions, in which each second neuron obtained with the aid of the inventive process is realized by a digital base circuit. The digital base circuit has a combinational digital circuit for generating the set of Boolean functions which replaces a second neuron for any values of its input weighting factors, a demultiplexer following the combinational digital circuit, and a register for controlling the demultiplexer and a clock input. An address decoder is provided, by means of which the clock inputs of all the digital base circuits can be driven individually.

In a process of the present invention for training the above-described circuit the register contents of the base circuits are alterable in a random manner in order to minimize a cost function. The probability of an alteration of register contents, which is linked to an increase in the value of the cost function, decreases over time. The cost function is the sum of the exclusive-OR gatings of the responses of the circuit arrangement with nominal responses.

The process permits the realization of ADALINE-type neural networks whose inputs are Boolean (that is to say binary) variables using Boolean functions. In each case the Boolean functions which realize the ADALINE network are determined here for any possible values of the weighting factors. For this purpose, the neurons primarily present in the ADALINE network (termed first neurons in the text below) are developed in binary trees comprising adaptive linear combiners. In order for it to be possible to execute a development in binary trees, the numbers of inputs of the first neurons are assumed to be integral powers of two. The general applicability of the process is not affected thereby since each neuron with a number of inputs that is not a power of two can be extended by as many inputs with weighting factors of zero until finally the number of inputs is a power of two.

If a neuron of the ADALINE network has, for example, $2^n$ binary inputs, then this neuron is replaced by an equivalent tree comprising $n-2$ adaptive linear combiners with two inputs in each case, which is followed by a neuron with two inputs (termed second neuron in the text below).

In the second step of the process as claimed in claim 1, binary quantizers (that is to say sign decision means) are inserted between the outputs of all the adaptive linear combiners obtained in the first step and the inputs of the adaptive linear combiners following them, with the result that the adaptive linear combiners are converted into second neurons.

In the third step of the process, the weighting factors of those second neurons which correspond to the leaves of the binary trees are selected to correspond to the weighting factors of the first neurons. Following this, in the fourth step of this process, the weighting factors of the other second neurons on the branches of the binary trees, which are preceded by the binary quantizers, are set to be equal to the absolute amounts of the output values of the adaptive linear combiners preceding said quantizers. Finally, in the last step of the process, all $n-1$ second neurons are replaced by their corresponding Boolean functions of two variables depending on their input weighting factors.

The circuit arrangement represents a purely digital realization of ADALINE-type neural networks in which each second neuron obtained with the aid of the process as claimed in claim 1 is realized by a digital base circuit. The digital base circuit is able to calculate all Boolean functions which an ADALINE with two binary inputs signals can realize for any values of its two weighting factors.

The invention furthermore includes a process for training the inventive circuit arrangement. In contrast to known training processes for ADALINE networks, the training process bears no relation to the continuously variable weighting factors of the original neural network, but rather alters the register contents of the base circuits in a random manner with the aim of minimizing a cost function.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 2:
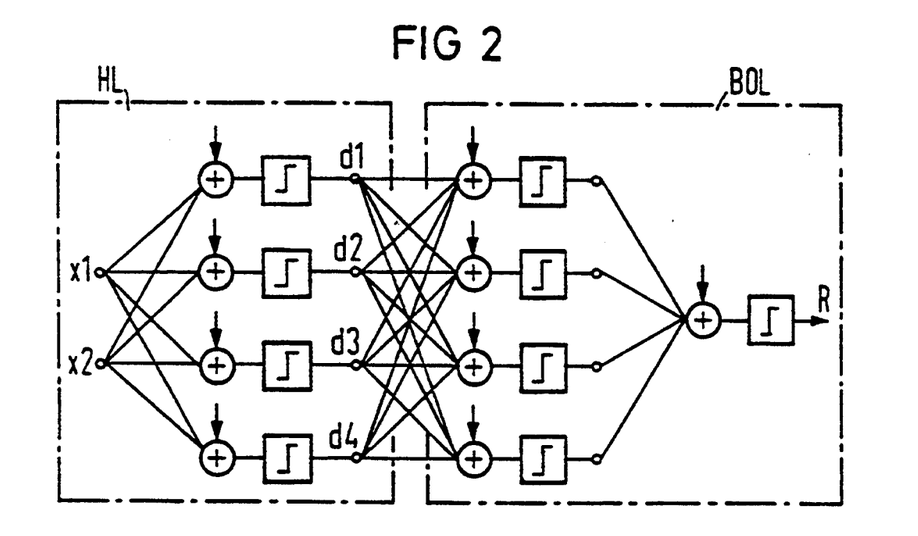
FIG. 2 shows the partitioning of a multilayer ADALINE network into the hidden layer (HL) and the Boolean output layer (BOL).
Figure 3:
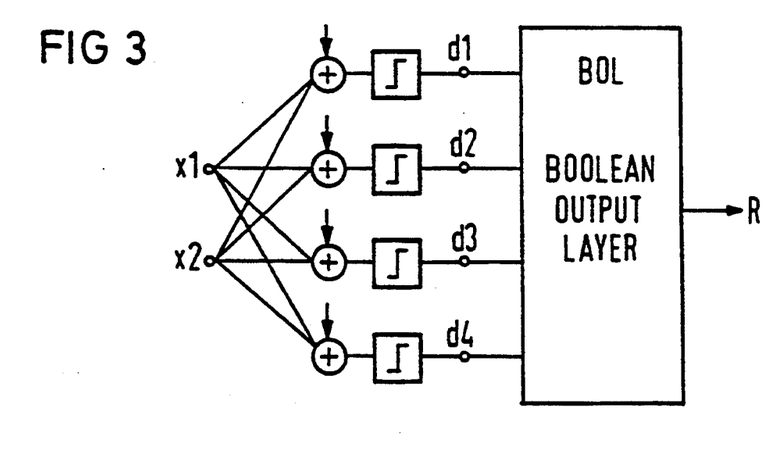
FIG. 3 shows the composition of a general ADALINE network comprising hidden layer and Boolean output layer.

To describe the preferred exemplary embodiment, a three-layer ADALINE network with N inputs and one output will be examined. The more general case with a plurality of outputs emerges from this special case without further considerations. It is furthermore assumed that the N inputs of the ADALINE network in question may assume not only binary values, but multi-stage or continuous values. Since the output signals d1, . . . d4 (FIG. 2) of the first layer (HL) are always limited to binary values, to be precise even if the input signals x1, x2 (FIG. 2) are multi-stage or continuous, the two upper layers form an ADALINE network with binary inputs, the Boolean output layer (BOL), which in the case in question has a binary output R (FIGS. 2 and 3).

The subject-matter of the invention is solely the Boolean output layer (BOL), which is identical to the overall ADALINE network in all cases where the N inputs are limited to binary (Boolean) values.

Figure 1:
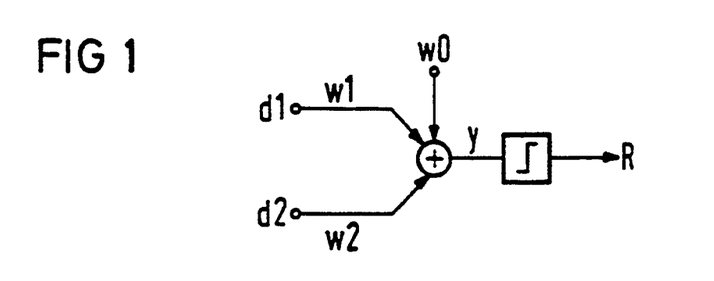
FIG. 1 shows the signal flow diagram of an ADALINE neuron with two inputs.
Figure 5:
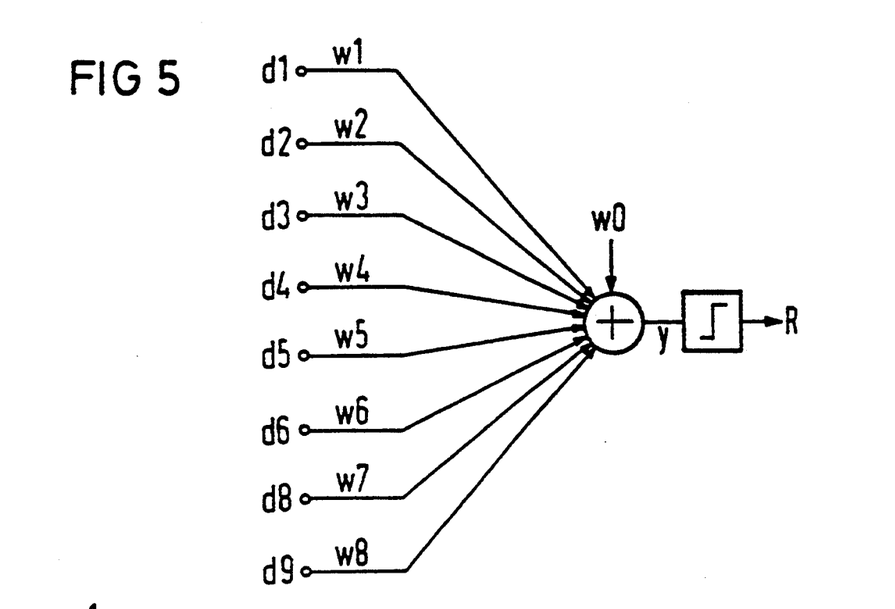
FIG. 5 shows the signal flow diagram of an ADALINE neuron with eight inputs.

FIGS. 1 and 5 show two ADALINE neurons with two and eight inputs respectively and the weighting factors w1, w2, and w1, . . . w8, respectively. The zero input denoted by w0 is equivalent to a shift of the sign decision. Any number of inputs to which zero is applied can always be added to an ADALINE neuron with N inputs without changing its function in any way. This circumstance makes it possible, without restricting the general applicability, for each neuron present in the network to have a number of inputs which is an integral power of 2.

Figure 6:
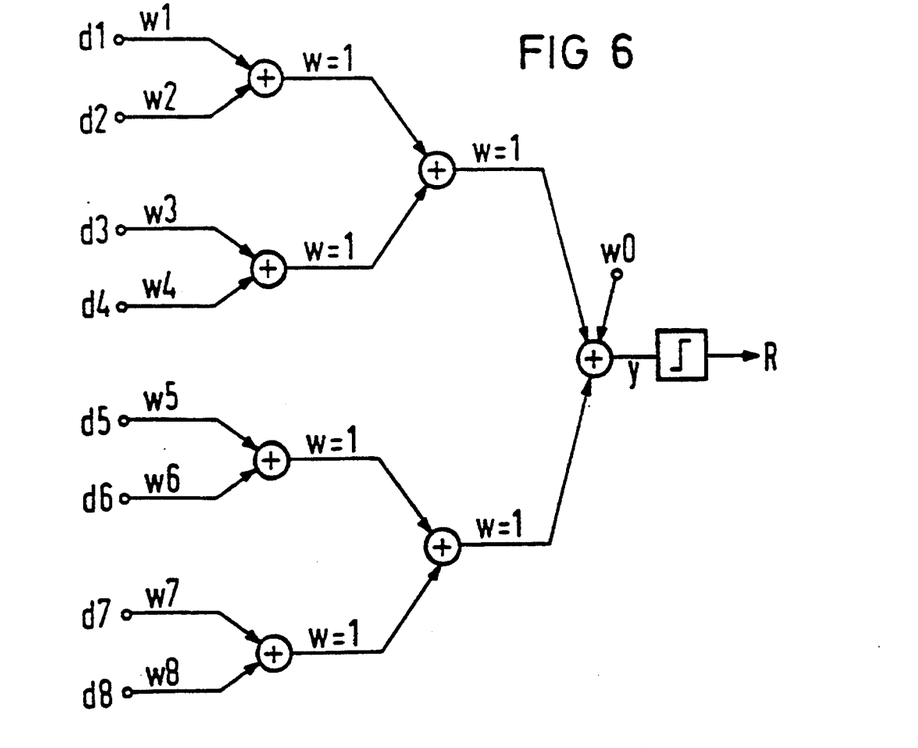
FIG. 6 shows the development of an ADALINE neuron with eight inputs in a binary tree comprising adaptive linear combiners.

The first step of the process is to develop each first neuron with, for example, $2^n$ inputs in a binary tree comprising $n-2$ adaptive linear combiners, at the root of which a second neuron with two inputs calculates a binary output R. FIG. 6 shows the development of the first neuron shown in FIG. 5 in a binary tree comprising adaptive linear combiners. FIG. 1 shows a second neuron, as can be seen at the root of the binary tree in FIG. 6 for example.

For general execution of the first process step, the $2^n$ binary inputs of each first neuron are combined in pairs. Each pair of inputs is summed with the aid of an adaptive linear combiner. The $2^{n-1}$ sum signals are linearly combined, that is to say added, in pairs with the weighting factor 1. The pair-by-pair addition of sum signals is continued until only two sum signals are still present. The sum signals are supplied to the adder of the originally present first neuron or, which is equivalent thereto, are supplied to the inputs of a second neuron, the two weighting factors of which initially assume the value 1. The binary tree thus produced comprising adaptive linear combiners and an ADALINE neuron with two inputs is equivalent to the first neuron with $2^n$ binary inputs.

In the second step of the process, the linear combiners obtained in the first step are converted into second neurons, in that sign decision means (single-stage quantizers) are inserted between the outputs of all the adaptive linear combiners and the inputs of the combiners following them. So that the binary tree thus obtained comprising second neurons (FIG. 7) continues to be equivalent to the original first neuron, in the third step of the process the weighting factors of those second neurons which correspond to the leaves of the binary tree are selected to correspond to the weighting factors of the first neuron, and in the fourth step the weighting factors of the other second neurons on the branches of the binary trees are set to be equal to the absolute amounts of the output values of the combiners preceding them (FIG. 7).

Figure 7:
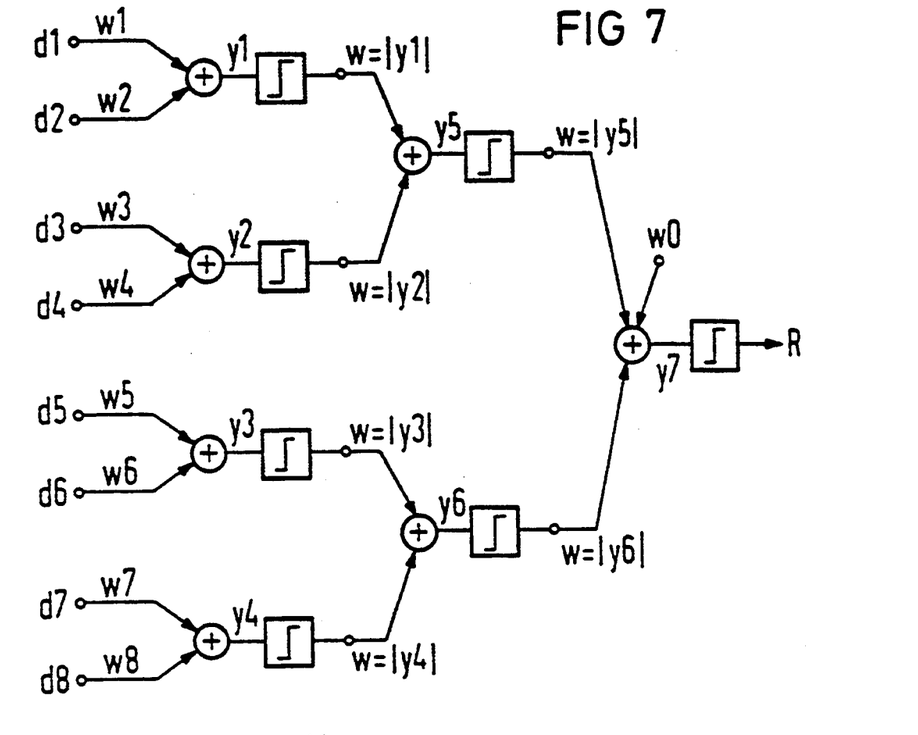
FIG. 7 shows the binary tree comprising seven binary second ADALINE neurons equivalent to a first ADALINE neuron with eight inputs.
Figure 8:
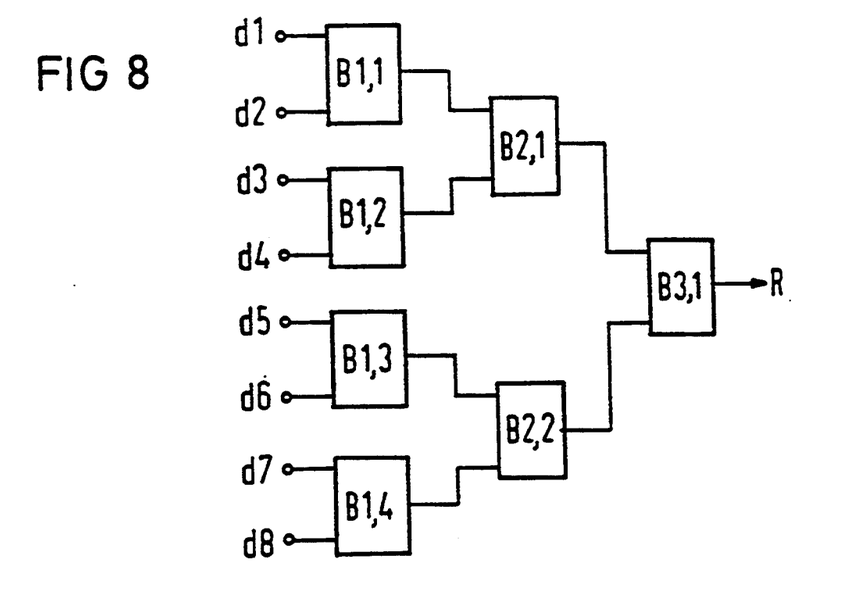
FIG. 8 shows a binary tree comprising digital base circuits equivalent to an ADALINE neuron with eight inputs.

The binary tree thus obtained comprising second neurons, which FIG. 7 shows for the case of a first neuron with eight inputs, is again equivalent to the first neuron of the original ADALINE network. Any ADALINE networks can be converted in this way into networks comprising ADALINEs with only two inputs (FIG. 1). ADALINEs with only two binary inputs (second neurons) have the advantage over general ADALINEs that their characteristics can be described in a very clear manner by a set of Boolean functions. The ADALINE in FIG. 1 is described by the equations $$y = \omega 0 + w1\, d1 + w2\, d2 \tag{1}$$

$$R = SGN(y) = \begin{cases} 1 & \text{if } y \geq 0 \\ -1 & \text{if } y < 0 \end{cases} \tag{2}$$

Given d1, d2$\epsilon\{-1+1\}$, there are 14 possible Boolean functions of 16 conceivable ones, depending on the values of the weighting factors w0, w1 and w2, which functions can be realized by the equations (1) and (2). The non-realizable functions are the exclusive-OR gating and the negated exclusive-OR gating.

Figure 4:
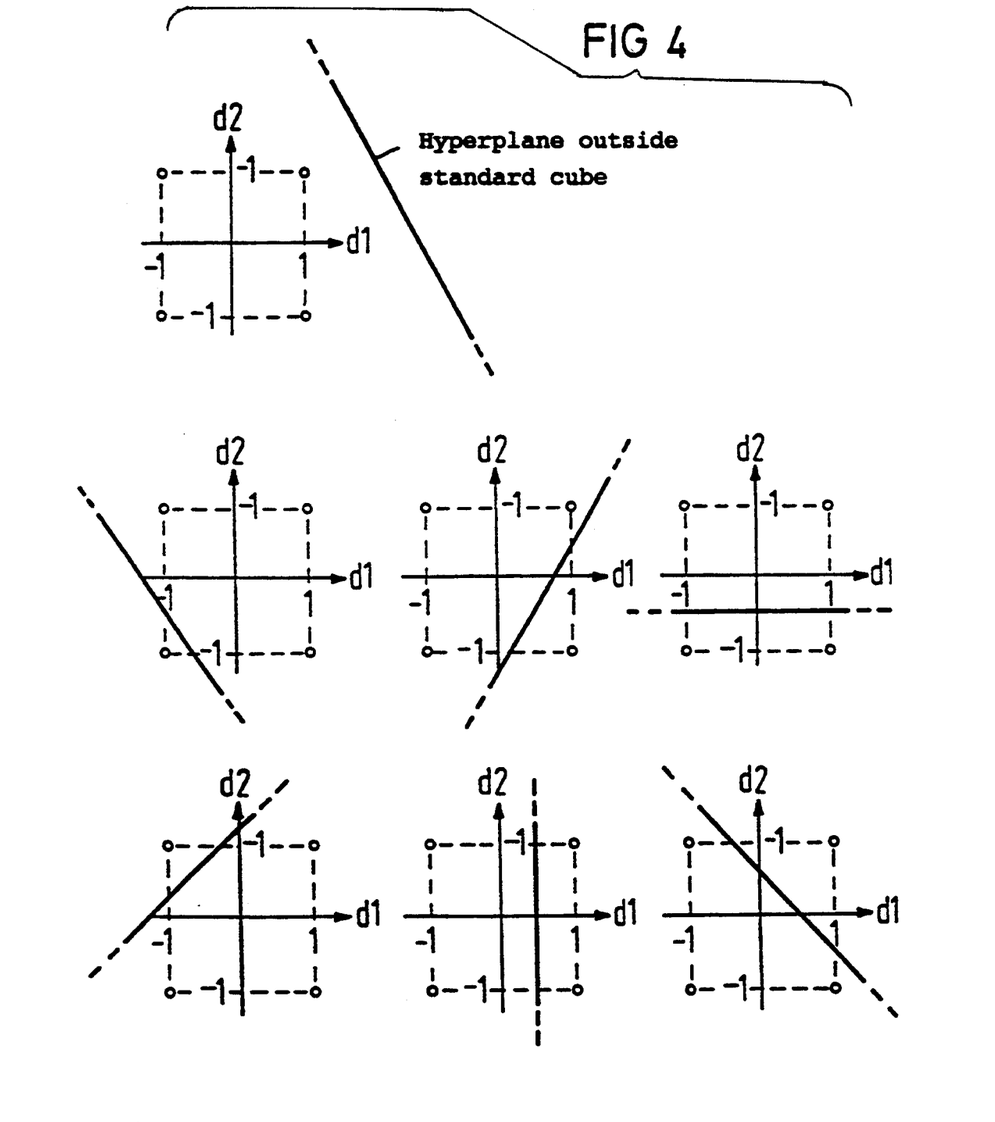
FIG. 4 shows the possible classifications of the input patterns of an ADALINE neuron with two binary inputs, represented as corner points of the binary 2-cube, separated by a hyperplane as a function of the input weighting factors.

FIG. 4 shows seven diagrams which can be extended to 14 diagrams by mirroring the hyperplane at the origin of the coordinates. Said 14 diagrams correspond to the 14 Boolean functions that can be realized with the aid of a second neuron (ADALINE with two binary inputs). The Boolean functions are obtained from the diagrams by assigning the points (input values) on the one side of the hyperplane to the output value 1 for "true" and the points on the other side of the hyperplane to the output value $-1$ for "false".

The fifth and hence last step of the process now comprises replacing the second neurons obtained in the fourth step by their corresponding Boolean functions depending on the values of their weighting factors. This is preferably executed by determining the corresponding one of the 14 diagrams according to FIG. 4 (or according to the diagrams obtained from the diagrams of FIG. 4 by mirroring the hyperplane at the origin of the coordinates) for each second neuron depending on the values of its weighting factors. For this, the axis sections d1, d2 are calculated from the equation $$y = w1\, d1 + w2\, d2 + w0 = 0 \tag{3}$$

for given weighting factors w0, w1 and w2, and the wanted Boolean function for each second neuron is obtained.

Figure 9:
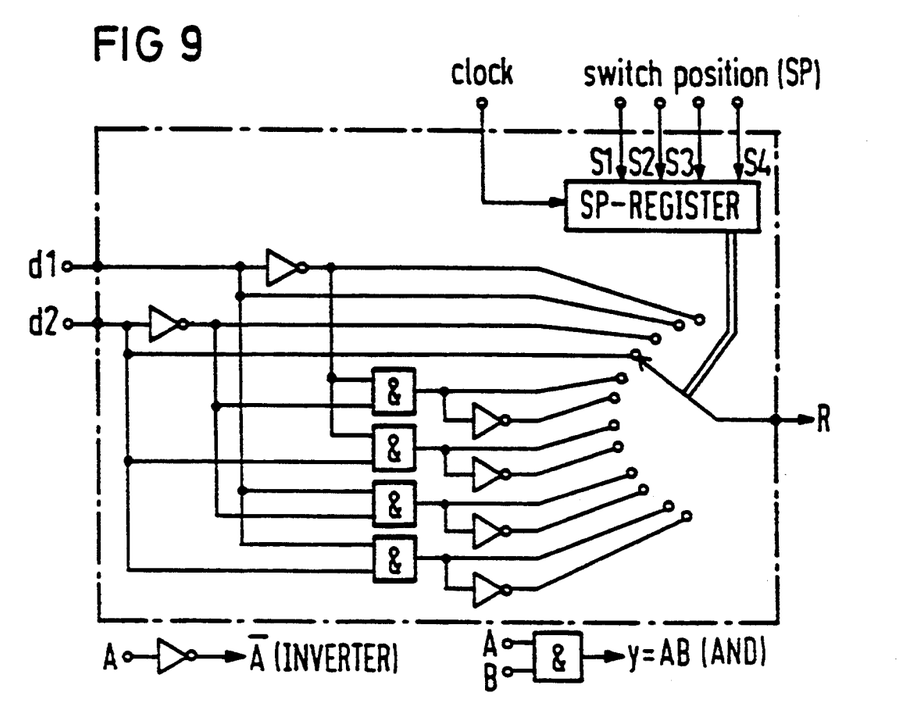
FIG. 9 shows a preferred embodiment of the digital base circuit.

The process can thus be viewed as a design process for a realization of an ADALINE network by means of digital circuits on the logic level. The actual construction of a digital circuit which realizes the ADALINE network in hardware will now be executed preferably using a universal base circuit as is shown in FIG. 9. The 12 non-trivial Boolean functions (two of the 14 Boolean functions are namely constantly "true" and constantly "false" respectively) are generated from the input signals d1, d2 of the base circuit, preferably with the aid of AND gates and inverters, which can calculate a second neuron depending on the values of its weighting factors in each case. The Boolean function required in each case is selected here by means of a demultiplexer which is controlled with the aid of an SP-register. The contents of the register (SP), which can be activated by a clock input, thus determine the function of the base circuit and hence the output values R. The contents of the register thus replace the weighting factors w1, ... wn, ... of the ADALINE network.

Figure 10:
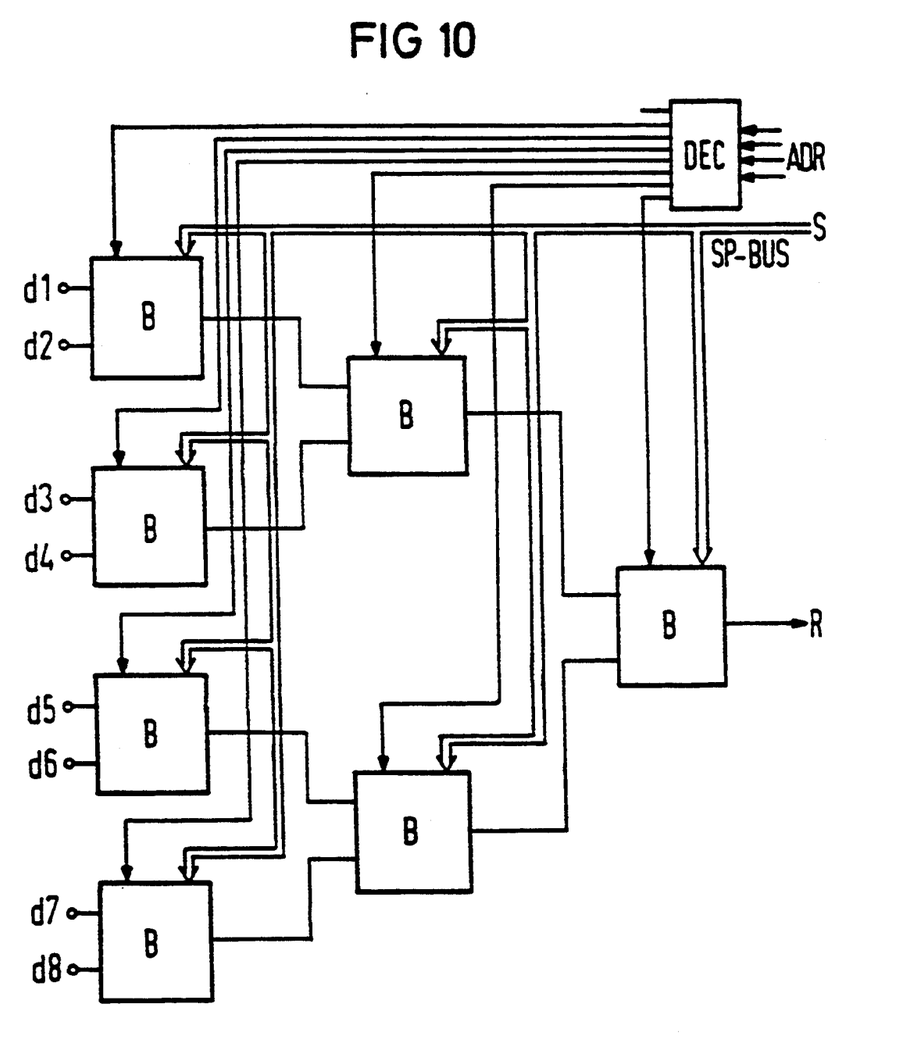
FIG. 10 shows the circuit arrangement for the digital realization of an ADALINE neuron with eight inputs.

FIG. 10 shows a preferred exemplary embodiment of the circuit arrangement for realizing ADALINE-type neural networks, in which the registers of the base cells are connected to an SP-bus S, via which the register contents can be written into the SP-register. The register to be written to in each case is selected (activated) via the clock inputs of the base circuits with the aid of an address decoder DEC which decodes the base circuit addresses ADR.

The circuit arrangement for realizing ADALINE-type neural networks cannot be trained using conventional training processes for neural networks since the variables of such conventional training processes are continuous weighting factors or discrete weighting factors that are variable in fine steps, which have no correspondence in the circuit arrangement for realizing ADALINE-type neural networks.

Figure 11:
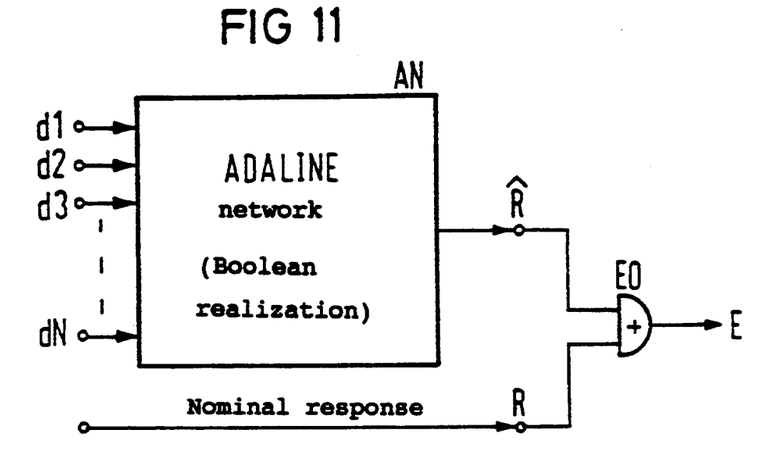
FIG. 11 shows a signal flow diagram for calculating the cost function.

The training process according to the invention is therefore based on an alteration of the register contents of the base circuits, by means of which, with the aid of the demultiplexer contained in the base circuit, the respective Boolean function required is selected from the set of Boolean functions calculated with the aid of the base circuit. The operation of the circuit arrangement in the course of the training process is illustrated with the aid of FIG. 11. Training data are applied to the inputs d1 to dn of the circuit arrangement. The network generates a decision $\hat{R}$ at its output depending on the information stored in the SP-registers of the base cells. The decision is compared with a desired decision (nominal response R). The comparison is carried out using the EXOR function. This operation is performed for all training vectors (pattern vectors) of the training data set. In this manner it is possible to state a cost function E which describes the measure of adaptation of the network to the training data. Such a cost function is preferably the sum of the values at the EXOR output for all training data:

$$E = \sum_{K=1}^{M} EXOR(\hat{R}_K, R_K) \quad (4)$$

M is the number of training vectors here. The cost function E describes the behavior of the network for the entire set of training data comprising M binary training vectors with N components in each case. The smaller the values E assumes, the better the network is adapted to the training data and the better decision behavior the network exhibits. On the other hand, E is a function of the settings of the SP-registers of the base cells.

The objective of the training process is to set the SP-registers, and hence the selection of possible Boolean functions of the base cells, in such a way that E assumes a minimum. An optimization task is thus defined which cannot be solved in the classical manner. For this reason, to minimize the cost function E, a stochastic optimization process is used for a given set of training data by suitable variation of the SP-register contents of the base cells, which is also termed simulated annealing (P. J. M. van Laarhoven and E. H. L. Aarts, "Simulated annealing: Theory and Applications", D. Reidel Publishing Comp., Dodrecht, 1987).

To execute the training process, a probability P is defined for the alteration of the register contents of a base cell in a training step:

$$p(t) = exp(-t/T). \quad (5)$$

Here t is the number of already executed training steps and T is a constant which determines the speed of the learning operation. Each training step includes a number of training passes. The cost function E for a set of training data and a set of SP-register contents is determined in one training pass. In the first training step all the SP-registers are stochastically altered before each training pass, that is to say all 12 possible settings of the SP-register are equally probable. This is performed preferably with the aid of a control computer, which forms part of an arrangement for executing the training process. The control computer generates in a random manner the SP-register contents and forwards them via the SP-bus to the circuit arrangement or, respectively, to the ADALINE network which is realized with the aid of base cells. In addition, all SP-register contents for which the cost function E contents is less than all the values of E hitherto calculated in the training process are stored in the control computer. The stored set of SP-register contents is thus the optimum setting of the network hitherto found.

The training passes for a probability P are continued until no further reduction of E is produced any more. The transition to the next training step then takes place by incrementing the time variable t of the learning process by the transition $t = t+1$, and this produces via equation (5) a new, reduced probability $P(t+1)$ of the SP-register setting of a base circuit being altered.

Figure 12:
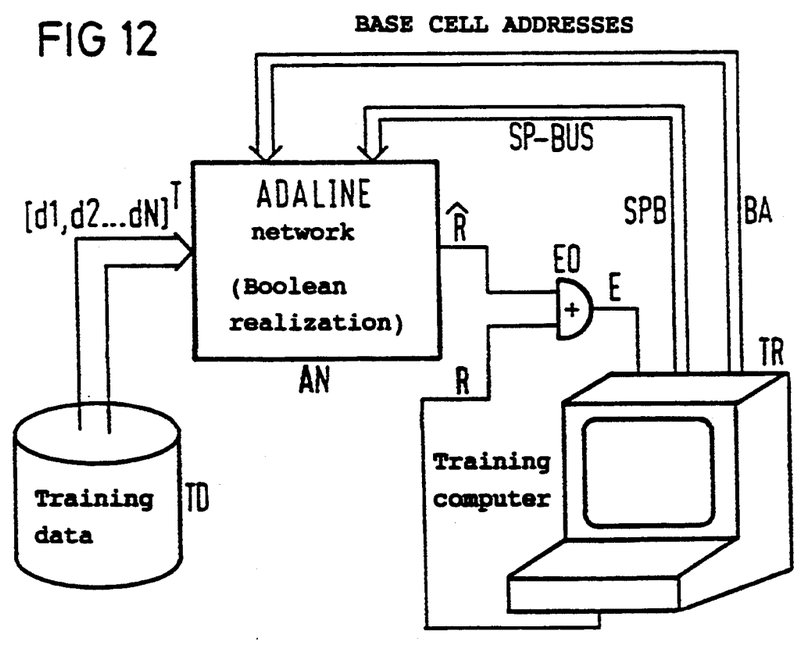
FIG. 12 shows a preferred embodiment of an arrangement for carrying out the training process.

The learning process is continued in this manner until the cost function E assumes a global minimum. This setting is then finally entered in the SP-registers. The training process is thus completed, and the network can be removed from the arrangement for executing the training process and supplied to its application. FIG. 12 shows the overall arrangement for executing the training process together with the associated training computer and the training data base.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A digital base circuit arrangement for constructing ADALINE-type neural networks, comprising:

first data input for receiving a first input signal, second data input for receiving a second input signal, clock input for receiving a clock signal and four control inputs for respectively receiving four control signals, and a data output;

means for generating, from the first and second input signals, Boolean function signals consisting of the first input signal, the second input signal, an inverse of the first input signal, an inverse of the second input signal, first, second, third and fourth AND operations of respective pairs of the first and the second input signals, the inverted first and the inverted second input signals, the first and the inverted second input signals, and the inverted first and the second input signals, and first, second, third and fourth respective inversions of the first, second, third and fourth AND operations, said means for generating connected to said first and second data inputs;

means for selecting one of said Boolean function signals as an output signal appearing on said data output, said means for selecting connected to said clock input, said four control inputs, said data output and said means for generating, wherein said output signal is dependent on values of said four control signals at a time defined by said clock signal.

2. The digital base circuit arrangement according to claim 1, wherein said means for selecting has a register having four input ports respectively connected to said four control inputs, having a clock port connected to said clock input and having an output port, and wherein said means for selecting also has a demultiplexer connected to said output port of said register and operatively connected to receive said Boolean function signals and output said output signal.

3. A digital circuit arrangement for realizing ADALINE-type neural networks, comprising:

a binary tree formed of digital base circuits, each of said digital base circuits having first and second data inputs and a data output, the binary tree having an input stage wherein respective digital base circuits receive input signals, an output stage wherein a respective digital base circuit provides an output signal, and at least one intermediate stage wherein one data input of a respective digital base circuit is connected to the output of a base circuit in a previous stage and the other data input of the respective digital base circuit is connected to the output of a further base circuit in the previous stage; each of said digital base circuits having, first data input for receiving a first input signal, second data input for receiving a second input signal, clock input for receiving a clock signal and four control inputs for respectively receiving four control signals, and a data output;

means for operating, from the first and second input signals, Boolean function signals consisting of the first input signal, the second input signal, an inverse of the first input signal, an inverse of the second input signal, first, second, third and fourth AND operations of respective pairs of the first and the second input signals, the inverted first and the inverted second input signals, the first and the inverted second input signals, and the inverted first and the second input signals, and first, second, third and fourth respective inversions of the first, second, third and fourth AND operations, said means for generating connected to said first and second data inputs;

means for selecting one of said Boolean function signals as an output signal appearing on said data output, said means for selecting connected to said clock input, and four control inputs, said data output and said means for generating, wherein said output signal is dependent on values of said four control signals at a time defined by said clock signal.

* * * * *